United States Patent
Myara et al.

(10) Patent No.: US 8,782,107 B2
(45) Date of Patent: Jul. 15, 2014

(54) DIGITAL FAST CORDIC FOR ENVELOPE TRACKING GENERATION

(75) Inventors: David Myara, Toulouse (FR); Nadim Khlat, Cugnaux (FR); Jérémie Rafin, Midi-Pyrennees (FR)

(73) Assignee: RF Micro Devices, Inc., Greensboro, NC (US)

( * ) Notice: Subject to any disclaimer, the term of this patent is extended or adjusted under 35 U.S.C. 154(b) by 375 days.

(21) Appl. No.: 13/297,490

(22) Filed: Nov. 16, 2011

(65) Prior Publication Data

US 2012/0121039 A1 May 17, 2012

Related U.S. Application Data

(60) Provisional application No. 61/414,085, filed on Nov. 16, 2010.

(51) Int. Cl.
*G06F 7/00* (2006.01)
*G06F 7/38* (2006.01)

(52) U.S. Cl.
USPC .......................................... 708/201; 708/441

(58) Field of Classification Search
CPC ................................................... G06F 7/4818
USPC ........................................ 708/201, 441, 442
See application file for complete search history.

(56) References Cited

U.S. PATENT DOCUMENTS

| | | | |
|---|---|---|---|
| 3,969,682 A | 7/1976 | Rossum | |
| 3,980,964 A | 9/1976 | Grodinsky | |
| 4,587,552 A * | 5/1986 | Chin | 348/651 |
| 4,692,889 A * | 9/1987 | McNeely | 708/441 |
| 4,996,500 A | 2/1991 | Larson et al. | |
| 5,311,309 A | 5/1994 | Ersoz et al. | |
| 5,317,217 A | 5/1994 | Rieger et al. | |
| 5,351,087 A | 9/1994 | Christopher et al. | |

(Continued)

FOREIGN PATENT DOCUMENTS

| | | |
|---|---|---|
| EP | 0755121 A2 | 1/1997 |
| EP | 1492227 A1 | 12/2004 |

(Continued)

OTHER PUBLICATIONS

International Search Report for PCT/US2011/054106 mailed Feb. 9, 2012, 11 pages.
International Search Report for PCT/US12/40317 mailed Sep. 7, 2012, 7 pages.
International Search Report for PCT/US2012/046887 mailed Dec. 21, 2012, 12 pages.
Non-Final Office Action for U.S. Appl. No. 13/188,024, mailed Feb. 5, 2013, 8 pages.

(Continued)

*Primary Examiner* — Chuong D Ngo
(74) *Attorney, Agent, or Firm* — Withrow & Terranova, P.L.L.C.

(57) ABSTRACT

Disclosed is a coordinate rotation digital computer (CORDIC) having a maximum value circuit that selects a larger of the first component or the second component. A minimum value circuit selects a minimum operand that is a smaller one of the first component or the second component. Also included are N rotator stages, each corresponding to a unique one of N predetermined vectors, each of the N rotator stages having a first multiply circuit to multiply the maximum operand by a cosine coefficient of a predetermined vector to output a first rotation component, a second multiply circuit for multiplying the minimum operand by a sine coefficient of the predetermined vector to output a second rotation component, and an adder circuit for adding the first rotation component to the second rotation component to output one of N results, and a maximum value circuit for outputting a maximum one of the N results.

20 Claims, 5 Drawing Sheets

(56) References Cited

U.S. PATENT DOCUMENTS

| | | |
|---|---|---|
| 5,414,614 A | 5/1995 | Fette et al. |
| 5,420,643 A | 5/1995 | Romesburg et al. |
| 5,486,871 A | 1/1996 | Filliman et al. |
| 5,532,916 A | 7/1996 | Tamagawa |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow |
| 6,141,541 A | 10/2000 | Midya et al. |
| 6,147,478 A | 11/2000 | Skelton et al. |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,483,281 B2 | 11/2002 | Hwang |
| 6,559,689 B1 | 5/2003 | Clark |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,658,445 B1 | 12/2003 | Gau et al. |
| 6,681,101 B1 | 1/2004 | Eidson et al. |
| 6,690,652 B1 | 2/2004 | Sadri |
| 6,701,141 B2 | 3/2004 | Lam |
| 6,728,163 B2 | 4/2004 | Gomm et al. |
| 6,819,938 B2 | 11/2004 | Sahota |
| 6,958,596 B1 | 10/2005 | Sferrazza et al. |
| 6,995,995 B2 | 2/2006 | Zeng et al. |
| 7,058,373 B2 | 6/2006 | Grigore |
| 7,164,893 B2 | 1/2007 | Leizerovich et al. |
| 7,200,365 B2 | 4/2007 | Watanabe et al. |
| 7,233,130 B1 | 6/2007 | Kay |
| 7,279,875 B2 | 10/2007 | Gan et al. |
| 7,394,233 B1 | 7/2008 | Trayling et al. |
| 7,405,618 B2 | 7/2008 | Lee et al. |
| 7,411,316 B2 | 8/2008 | Pai |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 | 3/2010 | Li |
| 7,696,735 B2 | 4/2010 | Oraw et al. |
| 7,715,811 B2 | 5/2010 | Kenington |
| 7,724,837 B2 | 5/2010 | Filimonov et al. |
| 7,773,691 B2 | 8/2010 | Khlat et al. |
| 7,777,459 B2 | 8/2010 | Williams |
| 7,782,036 B1 | 8/2010 | Wong et al. |
| 7,783,269 B2 | 8/2010 | Vinayak et al. |
| 7,800,427 B2 | 9/2010 | Chae et al. |
| 7,805,115 B1 | 9/2010 | McMorrow et al. |
| 7,859,336 B2 | 12/2010 | Markowski et al. |
| 7,880,547 B2 | 2/2011 | Lee et al. |
| 7,894,216 B2 | 2/2011 | Melanson |
| 7,898,268 B2 | 3/2011 | Bernardon et al. |
| 7,898,327 B2 | 3/2011 | Nentwig |
| 7,907,010 B2 | 3/2011 | Wendt et al. |
| 7,915,961 B1 | 3/2011 | Li |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 | 9/2011 | Giovannotto |
| 8,068,622 B2 | 11/2011 | Melanson et al. |
| 8,081,199 B2 | 12/2011 | Takata et al. |
| 8,093,951 B1 | 1/2012 | Zhang et al. |
| 8,159,297 B2 | 4/2012 | Kumagai |
| 8,164,388 B2 | 4/2012 | Iwamatsu |
| 8,174,313 B2 | 5/2012 | Vice |
| 8,183,917 B2 | 5/2012 | Drogi et al. |
| 8,183,929 B2 | 5/2012 | Grondahl |
| 8,198,941 B2 | 6/2012 | Lesso |
| 8,204,456 B2 | 6/2012 | Xu et al. |
| 8,362,837 B2 | 1/2013 | Koren et al. |
| 8,541,993 B2 | 9/2013 | Notman et al. |
| 8,542,061 B2 | 9/2013 | Levesque et al. |
| 8,558,616 B2 | 10/2013 | Shizawa et al. |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 | 1/2014 | Khlat et al. |
| 8,638,165 B2 | 1/2014 | Shah et al. |
| 8,659,355 B2 | 2/2014 | Henshaw et al. |
| 2002/0071497 A1 | 6/2002 | Bengtsson et al. |
| 2003/0017286 A1 | 1/2003 | Williams et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0124913 A1 | 7/2004 | Midya et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0093630 A1 | 5/2005 | Whittaker et al. |
| 2005/0122171 A1 | 6/2005 | Miki et al. |
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0200407 A1 | 9/2005 | Arai et al. |
| 2006/0006946 A1 | 1/2006 | Burns et al. |
| 2006/0097711 A1 | 5/2006 | Brandt |
| 2006/0128324 A1 | 6/2006 | Tan et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2007/0014382 A1 | 1/2007 | Shakeshaft et al. |
| 2007/0024360 A1 | 2/2007 | Markowski |
| 2007/0082622 A1 | 4/2007 | Leinonen et al. |
| 2007/0146076 A1 | 6/2007 | Baba |
| 2007/0182392 A1 | 8/2007 | Nishida |
| 2007/0183532 A1 | 8/2007 | Matero |
| 2007/0259628 A1 | 11/2007 | Carmel et al. |
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0205095 A1 | 8/2008 | Pinon et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0280577 A1 | 11/2008 | Beukema et al. |
| 2009/0004981 A1 | 1/2009 | Eliezer et al. |
| 2009/0097591 A1 | 4/2009 | Kim |

(56) References Cited

U.S. PATENT DOCUMENTS

| | | |
|---|---|---|
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 | 7/2009 | Kazakevich et al. |
| 2009/0218995 A1 | 9/2009 | Ahn |
| 2009/0289720 A1 | 11/2009 | Takinami et al. |
| 2009/0319065 A1 | 12/2009 | Risbo |
| 2010/0017553 A1 | 1/2010 | Laurencin et al. |
| 2010/0045247 A1 | 2/2010 | Blanken et al. |
| 2010/0171553 A1 | 7/2010 | Okubo et al. |
| 2010/0253309 A1 | 10/2010 | Xi et al. |
| 2010/0266066 A1 | 10/2010 | Takahashi |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2011/0018626 A1 | 1/2011 | Kojima |
| 2011/0084760 A1 | 4/2011 | Guo et al. |
| 2011/0148375 A1 | 6/2011 | Tsuji |
| 2011/0234182 A1 | 9/2011 | Wilson |
| 2011/0235827 A1 | 9/2011 | Lesso et al. |
| 2011/0279180 A1 | 11/2011 | Yamanouchi et al. |
| 2012/0025907 A1 | 2/2012 | Koo et al. |
| 2012/0025919 A1 | 2/2012 | Huynh |
| 2012/0034893 A1 | 2/2012 | Baxter et al. |
| 2012/0068767 A1 | 3/2012 | Henshaw et al. |
| 2012/0133299 A1 | 5/2012 | Capodivacca et al. |
| 2012/0139516 A1 | 6/2012 | Tsai et al. |
| 2012/0154054 A1 | 6/2012 | Kaczman et al. |
| 2012/0170334 A1 | 7/2012 | Menegoli et al. |
| 2012/0176196 A1 | 7/2012 | Khlat |
| 2012/0194274 A1 | 8/2012 | Fowers et al. |
| 2012/0236444 A1 | 9/2012 | Srivastava et al. |
| 2012/0299647 A1 | 11/2012 | Honjo et al. |
| 2013/0034139 A1 | 2/2013 | Khlat et al. |
| 2013/0094553 A1 | 4/2013 | Paek et al. |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |

FOREIGN PATENT DOCUMENTS

| | | |
|---|---|---|
| EP | 1569330 A1 | 8/2005 |
| EP | 2214304 A1 | 8/2010 |
| EP | 2244366 A1 | 10/2010 |
| GB | 2462204 A | 2/2010 |
| GB | 2465552 A | 5/2010 |
| GB | 2484475 A | 4/2012 |
| WO | 0048306 A1 | 8/2000 |
| WO | 04002006 A1 | 12/2003 |
| WO | 2004082135 A2 | 9/2004 |
| WO | 2005013084 A2 | 2/2005 |
| WO | 2006073208 A1 | 7/2006 |
| WO | 2007107919 A1 | 9/2007 |
| WO | 2007149346 A2 | 12/2007 |

OTHER PUBLICATIONS

International Search Report and Written Opinion for PCT/US2012/062070, mailed Jan. 21, 2013, 12 pages.

Dixon, N., "Standardization boosts momentum for Envelope tracking," Microwave Engineers, Europe, Apr. 20, 2011, 2 pages, http://www.mwee.com/en/standardisation-boosts-momentum-for-envelope-tracking.html?cmp_ids=71&news_ids=222901746.

Knutson, P., et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.

Le, Hanh-Phuc et al., "A 32nm Fully Integrated Reconfigurable Switched-Capacitor DC-DC Convertor Delivering 0.55W/mmA2 at 81% Efficiency," 2010 IEEE International Solid State Circuits Conference, Feb. 20-24, 2010, pp. 210-212.

Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.

Unknown, "Nujira files 100th envelope tracking patent," CS: Compound Semiconductor, Apr. 11, 2011, 1 page.

Non-final Office Action for U.S. Appl. No. 12/112,006 mailed Apr. 5, 2010, 6 pages.

Notice of Allowance for U.S. Appl. No. 12/112,006 mailed Jul. 19, 2010, 6 pages.

International Search Report for PCT/US11/033037 mailed Aug. 9, 2011, 10 pages.

International Search Report for PCT/US2011/044857 mailed Oct. 24, 2011, 10 pages.

International Search Report for PCT/US11/49243 mailed Dec. 22, 2011, 9 pages.

Non-final Office Action for U.S. Appl. No. 11/113,873, now Patent No. 7,773,691 mailed Feb. 1, 2008, 17 pages.

Final Office Action for U.S. Appl. No. 11/113,873, now Patent No. 7,773,691, mailed Jul. 30, 2008, 19 pages.

Non-final Office Action for U.S. Appl. No. 11/113,873, now Patent No. 7,773,691, mailed Nov. 26, 2008, 22 pages.

Final Office Action for U.S. Appl. No. 11/113,873, now Patent No. 7,773,691, mailed May 4, 2009, 20 pages.

Non-final Office Action for U.S. Appl. No. 11/113,873, now Patent No. 7,773,691, mailed Feb. 3, 2010, 21 pages.

Notice of Allowance for U.S. Appl. No. 11/113,873, now Patent No. 7,773,691, mailed Jun. 9, 2010, 7 pages.

Kim, N. et al, "Ripple feedback filter suitable for analog/digital mixed-mode audio amplifier for improved efficiency and stability," Power Electronics Specialists Conference, vol. 1, Jun. 23, 2002, pp. 45-49.

International Search Report for PCT/US06/12619 mailed May 8, 2007, 2 pages.

International Search Report for PCT/US2011/061009 mailed Feb. 8, 2012, 14 pages.

Invitation to Pay Additional Fees and Where Applicable Protest Fee for PCT/US2011/061007 mailed Feb. 13, 2012, 7 pages.

Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.

International Search Report for PCT/US2011/064255 mailed Apr. 3, 2012, 12 pages.

Extended European Search Report for application 06740532.4 mailed Dec. 7, 2010, 7 pages.

Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.

Notice of Allowance for U.S. Appl. No. 13/188,024, mailed Jun. 18, 2013, 8 pages.

International Preliminary Report on Patentability for PCT/US2011/054106 mailed Apr. 11, 2013, 8 pages.

International Preliminary Report on Patentability for PCT/US2011/061007 mailed May 30, 2013, 11 pages.

International Preliminary Report on Patentability for PCT/US2011/061009 mailed May 30, 2013, 10 pages.

Non-Final Office Action for U.S. Appl. No. 13/423,649, mailed May 22, 2013, 7 pages.

Advisory Action for U.S. Appl. No. 13/222,484, mailed Jun. 14, 2013, 3 pages.

International Preliminary Report on Patentability for PCT/US2011/064255, mailed Jun. 20, 2013, 7 pages.

Notice of Allowance for U.S. Appl. No. 13/343,840, mailed Jul. 1, 2013, 8 pages.

International Search Report for PCT/US2012/023495 mailed May 7, 2012, 13 pages.

Hekkala, A. et al., "Adaptive time misalignment compensation in envelope tracking amplifiers," International Symposium on Spread Spectrum Techniques and Applications, Aug. 2008, pp. 761-765.

Invitation to Pay Additional Fees and Where Applicable Protest Fee for PCT/US2012/024124 mailed Jun. 1, 2012, 7 pages.

(56) References Cited

OTHER PUBLICATIONS

Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Notice of Allowance for U.S. Appl. No. 13/363,888, mailed Jul. 18, 2013, 9 pages.
Notice of Allowance for U.S. Appl. No. 13/222,453, mailed Aug. 22, 2013, 8 pages.
Non-Final Office Action for U.S. Appl. No. 13/367,973, mailed Sep. 24, 2013, 8 pages.
Notice of Allowance for U.S. Appl. No. 13/423,649, mailed Aug. 30, 2013, 8 pages.
Notice of Allowance for U.S. Appl. No. 13/316,229, mailed Aug. 29, 2013, 8 pages.
Quayle Action for U.S. Appl. No. 13/531,719, mailed Oct. 10, 2013, 5 pages.
Notice of Allowance for U.S. Appl. No. 13/550,060, mailed Aug. 16, 2013, 8 pages.
Notice of Allowance for U.S. Appl. No. 13/222,484, mailed Aug. 26, 2013, 8 pages.
Notice of Allowance for U.S. Appl. No. 13/602,856, mailed Sep. 24, 2013, 9 pages.
Non-final Office Action for U.S. Appl. No. 13/218,400 mailed Nov. 8, 2012, 7 pages.
Notice of Allowance for U.S. Appl. No. 13/316,229 mailed Nov. 14, 2012, 9 pages.
Non-final Office Action for U.S. Appl. No. 13/222,484 mailed Nov. 8, 2012, 9 pages.
International Preliminary Report on Patentability for PCT/US11/49243 mailed Nov. 13, 2012, 33 pages.
Non-final Office Action for U.S. Appl. No. 13/089,917 mailed Nov. 23, 2012, 6 pages.
Non final Office Action for U.S. Appl. No. 13/222,453 mailed Dec. 6, 2012, 13 pages.
International Preliminary Report on Patentability for PCT/US2011/033037 mailed Oct. 23, 2012, 7 pages.
Final Office Action for U.S. Appl. No. 13/297,470, mailed Oct. 25, 2013, 17 pages.
Notice of Allowance for U.S. Appl. No. 14/022,858, mailed Oct. 25, 2013, 9 pages.
Non-Final Office Action for U.S. Appl. No. 13/550,049, mailed Nov. 25, 2013, 6 pages.
Non-Final Office Action for U.S. Appl. No. 12/836,307, mailed Nov. 5, 2013, 6 pages.
Examination Report for European Patent Application No. 11720630, mailed Aug. 16, 2013, 5 pages.
Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.
Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.
International Preliminary Report on Patentability for PCT/US2012/040317, mailed Dec. 12, 2013, 5 pages.
Notice of Allowance for U.S. Appl. No. 13/531,719, mailed Dec. 30, 2013, 7 pages.
Non-Final Office Action for U.S. Appl. No. 14/022,940, mailed Dec. 20, 2013, 5 pages.
International Search Report and Written Opinion for PCT/US2013/052277, mailed Jan. 7, 2014, 14 pages.
Li et al., "A highly efficient SiGe differential power amplifier using an envelope-tracking technique for 3GPP LTE applications," IEEE Bipolar/BiCMOS Circuits and Technology Meeting (BCTM), Oct. 4-6, 2010, pp. 121-124.
Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.
International Search Report for PCT/US2011/061007 mailed Aug. 16, 2012, 16 pages.
International Search Report for PCT/US2012/024124 mailed Aug. 24, 2012, 14 pages.
International Search Report for US PCT/US2012/036858 mailed Aug. 9, 2012, 7 pages.
International Search Report for US PCT/US2012/036858 mailed Aug. 10, 2012, 8 pages.
International Preliminary Report on Patentability for PCT/US2011/044857 mailed Mar. 7, 2013, 6 pages.
Notice of Allowance for U.S. Appl. No. 13/218,400 mailed Apr. 11, 2013, 7 pages.
Non-Final Office Action for U.S. Appl. No. 13/297,470 mailed May 8, 2013, 15 pages.
Notice of Allowance for U.S. Appl. No. 13/222,453 mailed Feb. 21, 2013, 7 pages.
Final Office Action for U.S. Appl. No. 13/222,484 mailed Apr. 10, 2013, 10 pages.
International Search Report and Written Opinion for PCT/US2012/053654 mailed Feb. 15, 2013, 11 pages.
International Search Report and Written Opinion for PCT/US2012/067230 mailed Feb. 21, 2013, 10 pages.
International Preliminary Report on Patentability for PCT/US2012/024124, mailed Aug. 22, 2013, 8 pages.
International Preliminary Report on Patentability for PCT/US2012/023495, mailed Aug. 15, 2013, 10 pages.
International Preliminary Report on Patentability for PCT/US2012/046887, mailed Jan. 30, 2014, 8 pages.
International Preliminary Report on Patentability for PCT/US2012/053654, mailed Mar. 13, 2014, 7 pages.
International Search Report and Written Opinion for PCT/US2013/065403, mailed Feb. 5, 2014, 11 pages.
Non-Final Office Action for U.S. Appl. No. 13/297,470, mailed Feb. 20, 2014, 16 pages.
Notice of Allowance for U.S. Appl. No. 13/550,049, mailed Mar. 6, 2014, 5 pages.
Non-Final Office Action for U.S. Appl. No. 13/661,552, mailed Feb. 21, 2014, 5 pages.
Examination Report for European Patent Application No. 11720630.0 issued Mar. 18, 2014, 4 pages.
International Search Report and Written Opinion for PCT/US2012/062110 issued Apr. 8, 2014, 12 pages.
International Preliminary Report on Patentability for PCT/US20121062070 mailed May 8, 2014, 8 pages.
International Preliminary Report on Patentability for PCT/US20121062110 mailed May 8, 2014, 9 pages.
Notice of Allowance for U.S. Appl. No. 12/836,307 mailed May 5, 2014, 6 pages.
Non-Final Office Action for U.S. Appl. No. 13/367,973 mailed Apr. 25, 2014, 5 pages.
Non-Final Office Action for U.S. Appl. No. 13/647,815 mailed May 2, 2014, 6 pages.
Non-Final Office Action for U.S. Appl. No. 13/689,883 mailed Mar. 27, 2014, 13 pages.
Non-Final Office Action for U.S. Appl. No. 13/692,084 mailed Apr. 10, 2014, 6 pages.
Non-Final Office Action for U.S. Appl. No. 13/684,826 mailed Apr. 3, 2014, 5 pages.
Non-Final Office Action for U.S. Appl. No. 13/951,976 mailed Apr. 4, 2014, 7 pages.
Non-Final Office Action for U.S. Appl. No. 13/714,600 mailed May 9, 2014, 14 pages.
Notice of Allowance for U.S. Appl. No. 14/022,858 mailed May 27, 2014, 6 pages.

* cited by examiner

US 8,782,107 B2

DIGITAL FAST CORDIC FOR ENVELOPE TRACKING GENERATION

RELATED APPLICATIONS

This application claims the benefit of provisional patent application Ser. No. 61/414,085, filed Nov. 16, 2010, the disclosure of which is hereby incorporated herein by reference in its entirety. This application Ser. No. 13/297,470 is also related to a concurrently filed utility application entitled DIGITAL FAST DB TO GAIN MULTIPLIER FOR ENVELOPE TRACKING SYSTEMS, the disclosure of which is incorporated herein by reference in its entirety.

FIELD OF THE DISCLOSURE

The present disclosure relates to a method and system that calculates the norms of a stream of vectors at a relatively high rate.

BACKGROUND

An envelope tracking system generates an envelope signal that is used as a reference input for a fast switched-mode power supply (Fast SMPS). In turn, the Fast SMPS uses the envelope signal to modulate a supply of a power amplifier for an increased efficiency. At present, an envelope signal generated by traditional methods is not fast or accurate enough for use with the long term evolution (LTE) standard wherein an envelope modulation bandwidth can be as high as 1.5 times a modulation bandwidth. In fact, a 20 MHz LTE bandwidth requires about 30 MHz envelope bandwidth, which further requires a digital sampling clock of 104 MHz for improved oversampling. As a result, there is a need for a method and system that generates fast digital envelope signals using in-phase (I) and quadrature (Q) signals that drive an RF modulator.

SUMMARY

The present disclosure provides a coordinate rotation digital computer (CORDIC) for computing the norm of a vector having a first component and a second component. The CORDIC includes a first maximum value circuit for outputting a maximum operand that is a larger one of either an absolute value of the first component or an absolute value of the second component. A minimum value circuit outputs a minimum operand that is a smaller one of either an absolute value of the first component or an absolute value of the second component. The CORDIC has N rotator stages, each corresponding to a unique one of N predetermined vectors. Each of the N rotator stages has a first multiply circuit for multiplying the maximum operand by a cosine coefficient of a corresponding predetermined vector to output a first rotation component and a second multiply circuit for multiplying the minimum operand by a sine coefficient of the corresponding predetermined vector to output a second rotation component. Moreover, each of the N rotator stages include an adder circuit for adding the first rotation component to the second rotation component to output one of N results. The CORDIC also has a second maximum value circuit for outputting a maximum one of the N results.

Those skilled in the art will appreciate the scope of the disclosure and realize additional aspects thereof after reading the following detailed description in association with the accompanying drawings.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
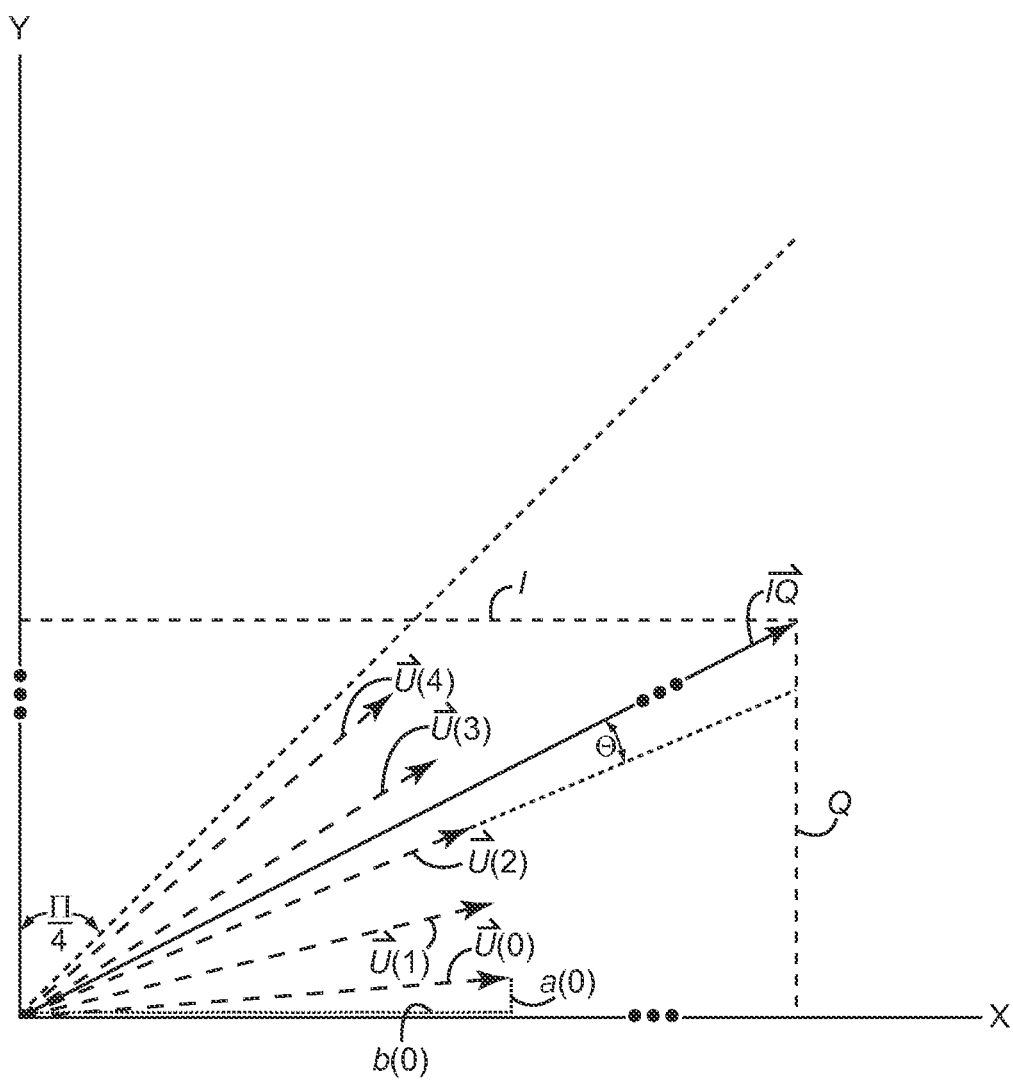
FIG. 1 is a vector graph that is useful in illustrating the concepts of the present disclosure.

FIG. 1 is a vector graph that is useful in illustrating the concepts of the present disclosure. The vector graph includes a vector $\overline{IQ}$ having a first component I and a second component Q. A goal of the method and system of the present disclosure is to find the norm of a vector such as the vector $\overline{IQ}$ using calculations fast enough to use the norm for radio frequency (RF) modulation. Preferably, the calculations provided by the present disclosure processes vectors at a rate on the order of millions of vectors per second. In order to achieve this relatively high rate of vector processing, tradition floating point calculations used by functions based upon the Pythagorean theorem are too inefficient. Instead, the present disclosure provides a system and method that uses a novel coordinate rotation digital computer (CORDIC) for computing the norm of a vector.

In particular, the system and method of the present disclosure provides an array of unit vectors $\overline{U}(i)$ that are used to effectively rotate the vector $\overline{IQ}$ significantly onto a quadrant axis. In FIG. 1, quadrant axes are labeled X and Y. Each of the unit vectors $\overline{U}(i)$ has a first component $a(i)$ and a second component $b(i)$. An exemplary list of numerical values for the unit vectors $\overline{U}(i)$, the first components $a(i)$, and the second components $b(i)$ are listed in TABLE 1 below.

TABLE 1

| iterator i | $\overline{U}(i)$ | $a(i)$ | $b(i)$ |
|---|---|---|---|
| 0 | $\overline{U}(0) = 1\angle 4.5°$ | 0.9969 | 0.0785 |
| 1 | $\overline{U}(1) = 1\angle 13.5°$ | 0.9724 | 0.2334 |
| 2 | $\overline{U}(2) = 1\angle 22.5°$ | 0.9239 | 0.3827 |
| 3 | $\overline{U}(3) = 1\angle 31.5°$ | 0.8526 | 0.5225 |
| 4 | $\overline{U}(4) = 1\angle 40.5°$ | 0.7604 | 0.6494 |

As will be explained in greater detail further in the disclosure, the vector $\overline{IQ}$ is multiplied by each of the unit vectors $\overline{U}(i)$ in order to calculate the norm for the vector $\overline{IQ}$. In an exemplary case shown in FIG. 1, the vector $\overline{IQ}$ has a first component I and a second component Q. Approximations of the norm are given by the following equation (1) with the assumption that the first component I is larger than the second component Q:

$$\text{norm} \approx (a(i)(|I|)+(b(i)(|Q|)) \tag{1}$$

The absolute values of the first component I and a second component Q are taken to ensure that the vector $\overline{IQ}$ is or becomes a first quadrant vector. Converting a vector to a first quadrant vector does not change the norm of the vector. Moreover, whenever the vector $\overline{IQ}$ has a second component Q that is larger than the first component I, the first component I and the second component Q are swapped in equation 1. In this way, the vector $\overline{IQ}$ is restricted to locations between angles ranging from 0° to 45° (i.e., 0 to π/4 radians).

A multiplication by one of the unit vectors $\overline{U}(i)$ yields a largest value. This largest value is the most accurate calculation of the norm for the vector $\overline{IQ}$ for the unit vectors U(i). The one of the unit vectors $\overline{U}(i)$ that yields the most accurate norm calculation will have the smallest angle difference with the vector $\overline{IQ}$. An angle Θ represents the smallest angle between one of the unit vectors $\overline{U}(i)$ and the vector $\overline{IQ}$.

In the exemplary case shown in FIG. 1, the vector $\overline{IQ}$ has a first component I having a value of 3599 and a second component Q having a value of 1822. Using equation (1), approximations of the norm of vector $\overline{IQ}$ for the exemplary case are shown in Table 2 below.

TABLE 2

| iterator i | $\overline{U}(i)$ | norm ≈ (a(i)(|I|) + (b(i)(|Q|)) |
|---|---|---|
| 0 | $\overline{U}(0) = 1\angle 4.5°$ | 3731 |
| 1 | $\overline{U}(1) = 1\angle 13.5°$ | 3925 |
| 2 | $\overline{U}(2) = 1\angle 22.5°$ | 4022 |
| 3 | $\overline{U}(3) = 1\angle 31.5°$ | 4021 |
| 4 | $\overline{U}(4) = 1\angle 40.5°$ | 3920 |

In this exemplary case, the unit vector $\overline{U}(2)$ has the smallest angle with the vector $\overline{IQ}$. As can be seen in Table 2, the largest calculated norm is 4022, which was calculated using the unit vector $\overline{U}(2)$. Referring to FIG. 1 the norm calculation of 4022 is reasonable because the unit vector $\overline{U}(2)$ is slightly closer to the vector $\overline{IQ}$ than the unit vector $\overline{U}(3)$. Using the Pythagorean Theorem, the actual norm for the vector $\overline{IQ}$ is close to 4034. Accuracy can be improved by increasing the number of unit vectors $\overline{U}(i)$ in the array.

Figure 2:
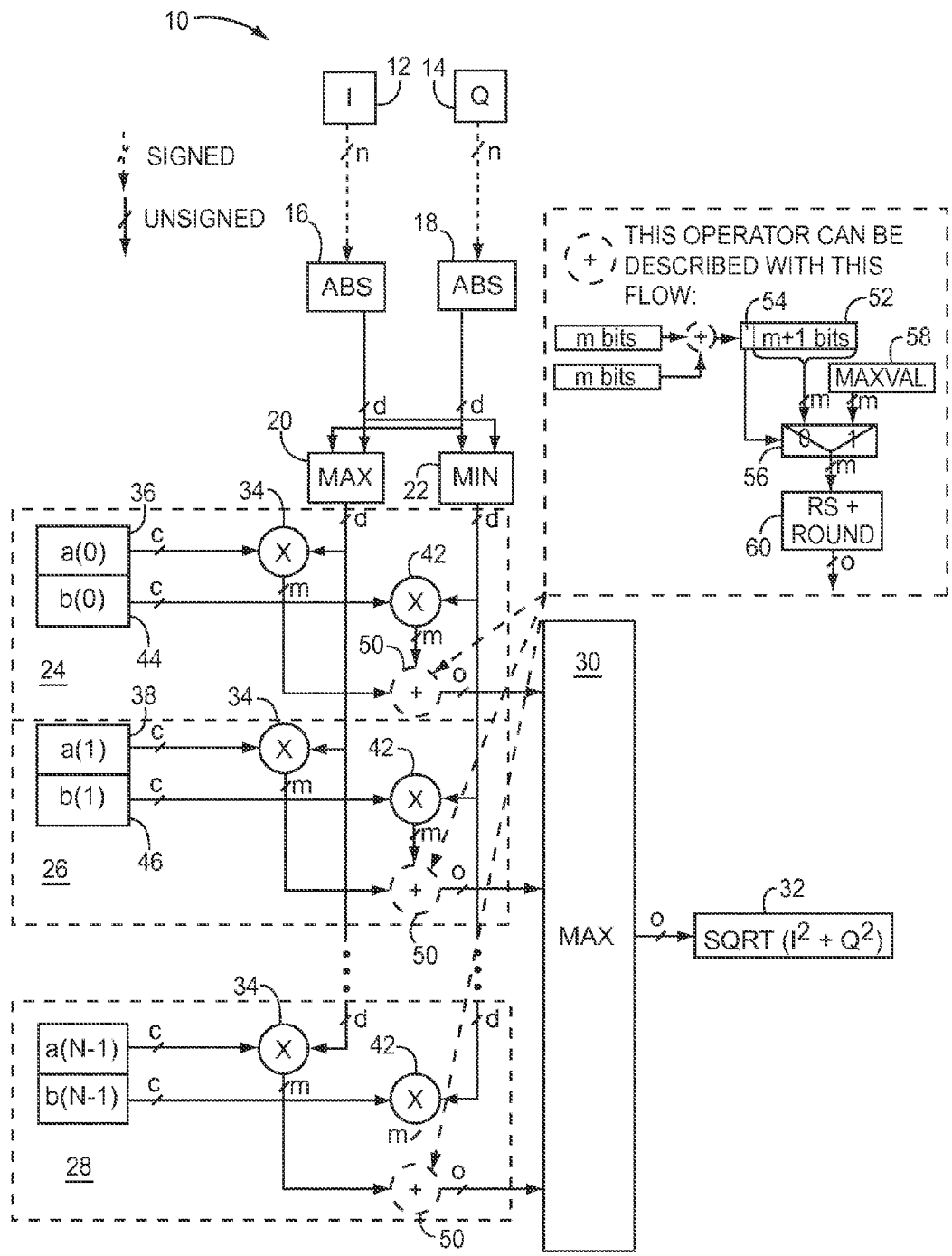
FIG. 2 is a block diagram of a first embodiment of a coordinate rotation digital computer (CORDIC) according to the present disclosure.

FIG. 2 is a block diagram of a first embodiment of a coordinate rotation digital computer (CORDIC) 10 that is in accordance with the present disclosure. The CORDIC 10 is made up of circuitry that digitally calculates the norms of a stream of vectors such as the vector $\overline{IQ}$ (FIG. 1). In particular, the CORDIC 10 includes an in-phase (I) input 12 and a quadrature (Q) input 14 that both except signed values that are both n bits wide. The I input 12 accepts the first component I of the vector $\overline{IQ}$, while the Q input 14 accepts the second component Q of the vector $\overline{IQ}$.

A first absolute value (ABS) circuit 16 outputs the absolute value of the first component I. A second ABS circuit 18 outputs the absolute value of the second component Q. In the particular case of the first embodiment CORDIC 10, the outputted values are d bits wide, wherein d=n−1.

A first maximum value (MAX) circuit 20 receives both the first component I and the second component Q and in turn outputs the larger value of the first component I and the second component Q. In contrast, a first minimum value (MIN) circuit 22 receives both the first component I and the second component Q and in turn outputs the smaller value of the first component I and the second component Q.

A first rotator stage 24, a second rotator stage 26 and an Nth rotator stage 28 simultaneously receive the larger value output from the first MAX circuit 20 and the smaller value output from the MIN circuit 22. One approximation of a norm for the vector $\overline{IQ}$ is calculated and output from the first rotator stage 24 based upon the larger value output from the first MAX circuit 20 and the smaller value output from the MIN circuit 22. Simultaneously, another approximation of the norm for the vector $\overline{IQ}$ is calculated and output from the second rotator stage 26 based upon the same larger value output from the first MAX circuit 20 and the same smaller value output from the MIN circuit 22. A last approximation of the norm for the vector $\overline{IQ}$ is simultaneously calculated and the output from the Nth rotator stage 28 is based upon the same larger value output from the first MAX circuit 20 and the same smaller value output from the MIN circuit 22. In this way, N approximations of the norm for the vector $\overline{IQ}$ are calculated by the CORDIC 10. A second MAX circuit 30 having an output 32 simultaneously receives the N approximations of the norm for the vector $\overline{IQ}$ and outputs the largest one of the N approximations of the norm for the vector $\overline{IQ}$. This largest one of the N approximations of the norm for the vector $\overline{IQ}$ is the closest approximation for the norm for the vector $\overline{IQ}$. A larger number of N rotator stages will yield a more accurate approximation for the norm for the vector $\overline{IQ}$ at the cost of additional circuitry and additional power needed to operate the additional circuitry.

The first rotator stage 24, the second rotator stage 26, and the Nth rotator stage 28 each have a multiply circuit 34 for multiplying the larger value, which is a maximum operand, by corresponding cosine coefficients a(i), wherein i is a natural number that ranges from 0 to N−1. For example, the cosine coefficient a(0) is stored in a memory location 36 for use by the first rotator stage 24. The cosine coefficient c is stored in a memory location 38 for use by the second rotator stage 26, and a cosine coefficient a(N−1) is stored in a memory location 40 for use by the Nth rotator stage 28. The memory location 36, the memory location 38, and the memory location 40 are each c bits wide. An equation for calculating the cosine coefficients is given by the following equation (2).

$$a(i) = 2^c \cdot \cos\left(\frac{\pi}{4N}i + \frac{\pi}{8N}\right) \cdot CorrectionFactor \tag{2}$$

The CorrectionFactor is a dimensionless correction factor that is usable for reducing the mean error over a plurality of calculations and is given by the following equation (3).

$$CorrectionFactor = \frac{1}{\frac{8N}{\pi} \cdot \sin\frac{\pi}{8N}} \tag{3}$$

Similarly, the first rotator stage 24, the second rotator stage 26, and the Nth rotator stage 28 each have a multiply circuit 42 for multiplying the smaller value, which is a minimum operand, by corresponding cosine coefficients b(i), wherein i is a natural number that ranges from 0 to N−1. A sine coefficient b(0) is stored in a memory location 44 for use by the first rotator stage 24. A sine coefficient b(1) is stored in a memory location 46 for use by the second rotator stage 26, and a sine coefficient b(N−1) is stored in a memory location 48 for use by the Nth rotator stage 28. The memory location 44, the memory location 46, and the memory location 48 are each c bits wide. An equation for calculating the sine coefficients is given by the following equation (4).

$$b(i) = 2^c \cdot \text{SIN}\left(\frac{\pi}{4N}i + \frac{\pi}{8N}\right) \cdot CorrectionFactor \qquad (4)$$

The CorrectionFactor is usable for reducing the mean error over a plurality of calculations and is given by the equation (3) above.

The first rotator stage 24, the second rotator stage 26, and the Nth rotator stage 28 each have an adder circuit 50 that receive m bit wide outputs from corresponding multiply circuits 34 and 42. Each adder circuit 50 outputs an o bit wide norm approximation to the second MAX circuit 30. Moreover, each adder circuit includes a results register 52 that is m bits wide plus an overflow bit 54 that controls a results multiplexer 56 that outputs either the addition results or a predetermined maximum value (MAXVAL) held in a memory location 58. In this particular embodiment the output of the multiplexer 56 will be addition results if the overflow bit is set to 0. In contrast, the output of the adder circuit will be the constant MAXVAL if the overflow bit is set to 1. A round and right shift (RS) circuit 60 rounds the addition results and then right shifts the results until only an o bit wide result remains.

Table 3 below lists word size configurations for an exemplary CORDIC having five rotator stages and another exemplary CORDIC having six rotator stages. Table 3 also lists the maximum error for a least significant byte (LSB) and the mean error LSB. The probability for an error greater than or equal to 0.5 LSB is 11.3% for a CORDIC with five rotator stages and 7.4% for a CORDIC having 7.4%.

TABLE 3

| N Rotator Stages | Input Bits n | Coefficient Bits c | Oper- and Bits d | Multi- ply Bits m | Output Bits o | Max. Error (LSB) | MEAN Error (LSB) |
|---|---|---|---|---|---|---|---|
| 5 | 13 | 9 | 12 | 11 | 8 | 1.09 | 0.046 |
| 6 | 13 | 10 | 12 | 13 | 8 | 0.90 | 0.010 |

Table 4 lists digital values for the coefficients of the first components a(i), and the second components b(i) of the unit vectors $\overline{U}(i)$ used by the first rotator stage 24, the second rotator stage 26, and the Nth rotator stage 28.

TABLE 4

| i | | 0 | 1 | 2 | 3 | 4 | 5 |
|---|---|---|---|---|---|---|---|
| N = 5 Rotator Stages | a(i) | 511 | 498 | 474 | 437 | 389 | |
| | b(i) | 40 | 121 | 195 | 268 | 334 | |
| N = 6 Rotator Stages | a(i) | 1023 | 1005 | 970 | 919 | 853 | 771 |
| | b(i) | 67 | 200 | 330 | 453 | 568 | 675 |

Referring back to Table 3, the five rotator stage example is configured for coefficients that are 9 bits in size. As a result, the maximum value for the coefficients of the five rotator stage example is 512. The six rotator stage example is configured for coefficients that are 10 bits in size. Therefore, the maximum value for the coefficients of the six rotator stage example is 1,024.ABdividing the coefficients of the first components a(i), and the second components b(i) by the maximum values 512 and 1024 for the five rotator stage example and the six rotator stage example yields decimal values listed in Table 5 below. Notice that the coefficients of the first components a(i), and the second components b(i) of the five rotator stage example in Table 5 are close to the first components a(i), and the second components b(i) of Table 1 multiplied by a CorrectionFactor of 1.001 that is calculated using equation (3).

TABLE 5

| i | | 0 | 1 | 2 | 3 | 4 | 5 |
|---|---|---|---|---|---|---|---|
| N = 5 Rotator Stages | a(i) | 0.9980 | 0.9727 | 0.9258 | 0.8535 | 0.7598 | |
| | b(i) | 0.0781 | 0.2363 | 0.3809 | 0.5234 | 0.6523 | |
| N = 6 Rotator Stages | a(i) | 0.9990 | 0.9814 | 0.9473 | 0.8975 | 0.8330 | 0.7529 |
| | b(i) | 0.0654 | 0.1953 | 0.3223 | 0.4424 | 0.5547 | 0.6592 |

Figure 3:
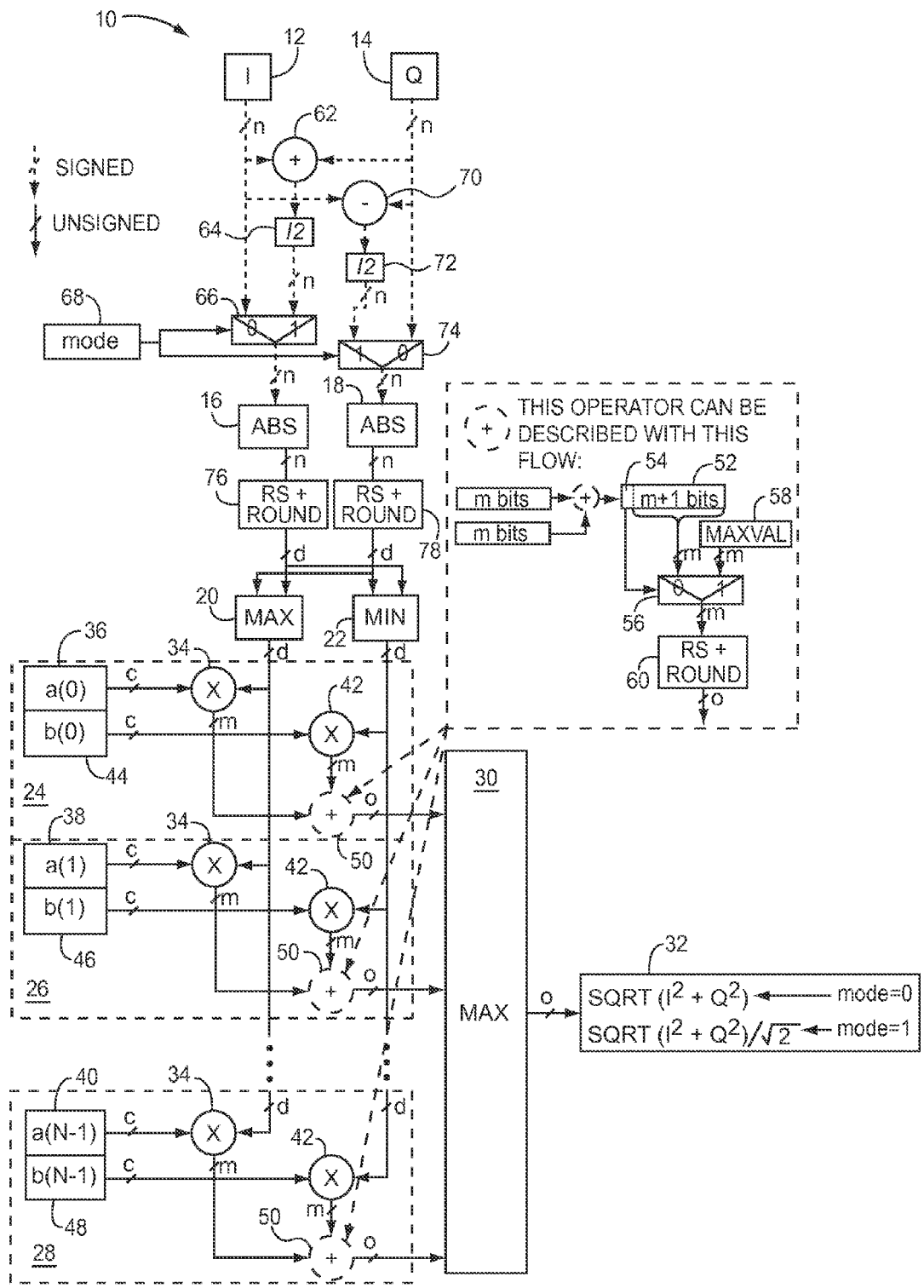
FIG. 3 is a block diagram of a second embodiment of the CORDIC according to the present disclosure.

FIG. 3 is a block diagram of a second embodiment of the CORDIC 10 that includes mode circuitry for providing outputs of norms that are divided by the square root of two. The mode circuitry is usable to process vectors associated with a square constellation such as a square quadrature amplitude modulation (QAM) constellation. In particular, the mode circuitry includes an input adder circuit 62 adds the first component I of the vector $\overline{IQ}$ (FIG. 1) to the second component Q of the vector $\overline{IQ}$. A first divider circuit 64 divides the result of the input adder circuit 62 by two. A first multiplexer 66 receives output from the I input 12 and the first divider circuit 64. A mode bit memory 68 provides a mode bit to the first multiplexer 66, which in turn uses the mode bit to select between outputting the first component I of the vector $\overline{IQ}$ or outputting the divided sum of the first component I of the vector $\overline{IQ}$ and the second component Q of the vector $\overline{IQ}$.

The mode circuitry further includes an input subtractor circuit 70 that subtracts the second component Q of the vector $\overline{IQ}$ from the first component I of the vector $\overline{IQ}$. A second divider circuit 72 divides the result of the input subtractor circuit 70 by two. A second multiplexer 74 receives output from the Q input 14 and the second divider circuit 72. A mode bit of 0 will result in a regular norm, whereas a mode bit of 1 will result in a norm divided by the square root of two.

An additional round and RS circuit 76 can be implemented if the width d of the output of the first MAX circuit 20 is less than the width n−1 of the I input 12. Likewise, another additional round and RS circuit 78 can be implemented if the width d of the output of the first MIN circuit 22 is less than the width n−1 of the Q input 14. In operation, the round and RS circuit 76 and the round and RS circuit 78 round their respective n bit wide contents before right shifting their n bit wide contents to drop lower bits until only d bits remain.

Figure 4:
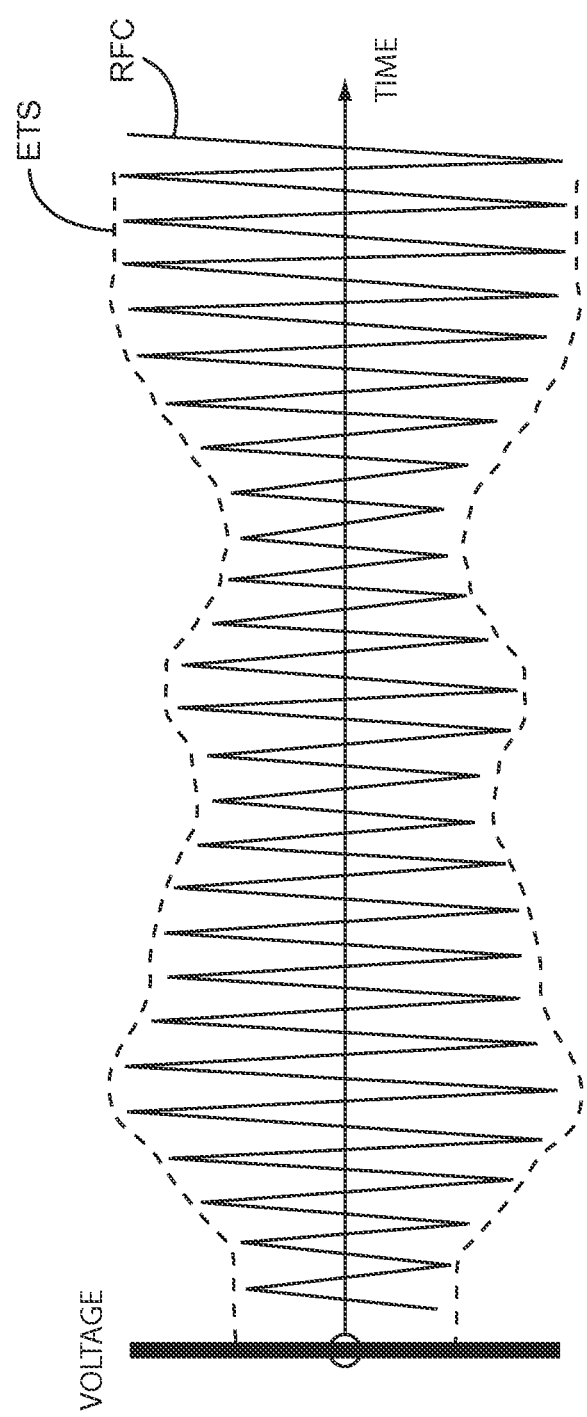
FIG. 4 is a voltage versus time graph of an envelope tracking signal that can be generated using output from the present CORDIC.

FIG. 4 is a voltage versus time graph of an envelope tracking signal (ETS) that can be generated using output from the CORDIC 10 (FIGS. 2 and 3). The ETS is shown in dashed lines and matches the modulation envelope of a modulated radio frequency carrier (RFC). The output from the CORDIC 10 does not produce the ETS directly. Instead, the CORDIC 10 is incorporated into other circuitry that forms the ETS.

Figure 5:
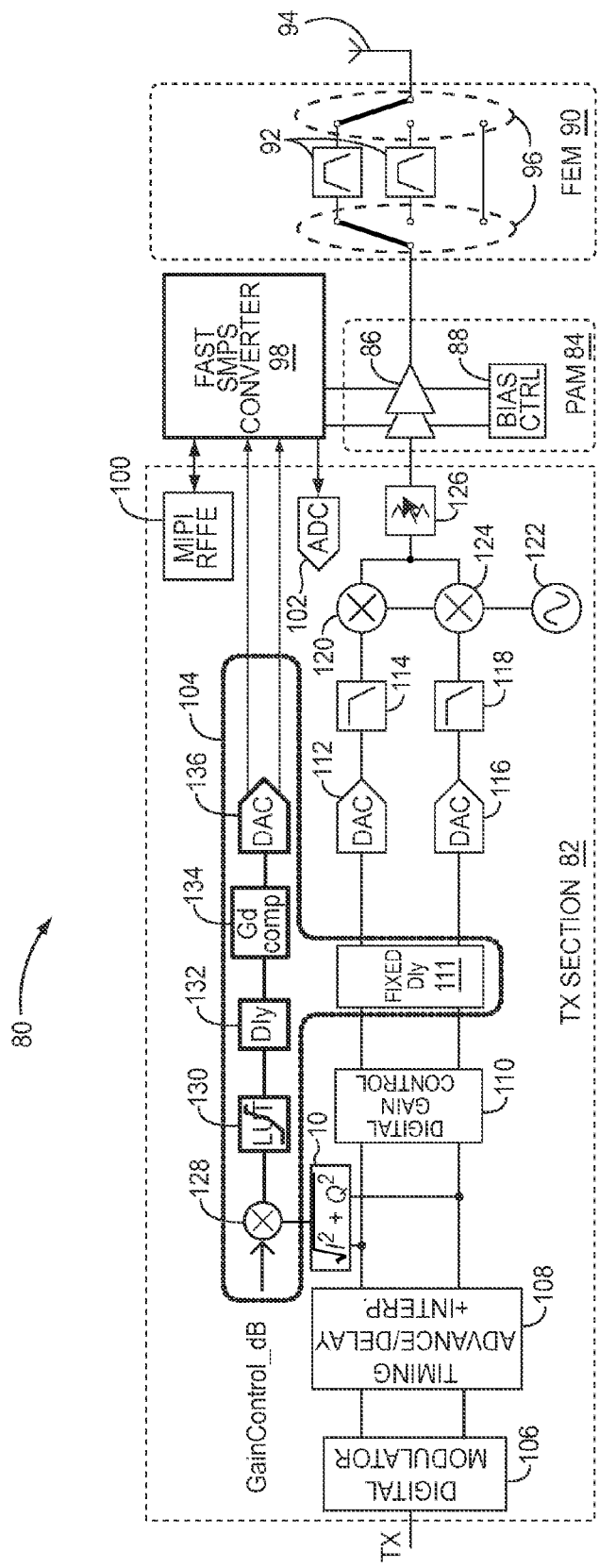
FIG. 5 is a block diagram of a digital envelope tracking system that incorporates the present CORDIC.

FIG. 5 is a block diagram of a digital envelope tracking system 80 that incorporates the CORDIC 10. The digital envelope tracking system 80 includes a transmitter section 82 that drives a power amplifier module (PAM) 84 having power amplifier stages 86 with a bias control 88. A front end module (FEM) 90 receives the output from the PAM 84 and passes the output through selectable filters 92 to a transmit antenna 94 via RF switches 96. A fast switch mode power supply (SMPS) converter 98 supplies power to the PAM 84. The fast SMPS converter 98 is controlled through a mobile industry processor interface (MIPI) RF front-end (RFFE) standard interface 100. A general purpose analog-to-digital converter (ADC) 102 is usable to monitor supply voltages provided to the PAM 84 by the fast SMPS converter 98.

The TX section 82 includes an ETS generator 104 that drives the fast SMPS converter 98 to produce the ETS (FIG. 4). The ETS generator 104 receives a digital gain control (GainControl_dB) signal along with a stream of norm outputs from the CORDIC 10.

The TX section 82 also includes a digital modulator 106 that separates a transmit signal TX into a digital in-phase (I) signal and a digital quadrature (Q) signal. A timing block 108 provides timing advances and delays for the digital I signal and the digital Q signal in response to base station requests. The timing block 108 also provides interpolation for achieving higher clock frequencies.

A digital gain control 110 provides gain to the digital I signal and the digital Q signal in cooperation with the GainControl_dB signal. The cooperation ensures that the amplitude of the ETS (FIG. 4) and the amplitude of the RFC (FIG. 4) substantially match. A fixed delay 111 on the order of nanoseconds ensures that the stream of norm values is synchronized with the propagation of the digital I signal and the digital Q signal that are output from the digital gain control 110. A first digital-to-analog converter (DAC) 112 converts the digital I signal into an analog I signal that is filtered by a first filter 114. Similarly, a second DAC 116 converts the digital Q signal into an analog Q signal that is filtered by a second filter 118.

A first mixer 120 mixes the analog I signal with an RF signal generated by an RF oscillator 122. A second mixer 124 mixes the analog Q signal with the RF signal. Mixed outputs from the first mixer 120 and the second mixer 124 combine to produce the modulated RFC shown in FIG. 4. A variable attenuator 126 is usable in cooperation with the GainControl_dB signal to adjust the gain of the RFC.

The ETS generator 104 includes a multiplier circuit 128 that multiplies GainControl_dB with the stream of norm values output from the CORDIC 10. A look-up-table (LUT) 130 provides pre-distortion to the stream of norms to match distortion produced by the power amplifier stages 86. A programmable delay 132 is usable to finely tune synchronization between the stream of norm values and the RFC (FIG. 4). A group delay compensator 134 is included to compensate for a dynamic bandwidth response of the fast SMPS converter 98. Lastly, the ETS generator has a third DAC 136 for converting the stream of norm values into a differential output that drives the fast SMPS converter 98.

Those skilled in the art will recognize improvements and modifications to the preferred embodiments of the present disclosure. All such improvements and modifications are considered within the scope of the concepts disclosed herein and the claims that follow.

What is claimed is:

1. A coordinate rotation digital computer (CORDIC) for computing a norm of a vector having a first component and a second component, comprising:
    a first maximum value circuit for outputting a maximum operand that is a larger one of either an absolute value of the first component or an absolute value of the second component;
    a minimum value circuit for outputting a minimum operand that is a smaller one of either an absolute value of the first component or an absolute value of the second component;
    N rotator stages, each corresponding to a unique one of N predetermined vectors, each having a first multiply circuit for multiplying the maximum operand by a cosine coefficient of a corresponding predetermined vector to output a first rotation component, a second multiply circuit for multiplying the minimum operand by a sine coefficient of the corresponding predetermined vector to output a second rotation component and an adder circuit for adding the first rotation component to the second rotation component to output one of N results; and
    a second maximum value circuit for outputting a maximum one of the N results.

2. The CORDIC of claim 1 wherein the N predetermined vectors are unit vectors.

3. The CORDIC of claim 1 wherein each adder circuit of the N rotator stages comprises:
    a results register having an overflow bit that is set when a result of an addition performed by the adder circuit is larger than the results register; and
    a results multiplexer that outputs the result of an addition performed by the adder circuit if the overflow bit is not set or outputs a predetermined maximum value if the overflow bit is set.

4. The CORDIC of claim 1 wherein each adder circuit of the N rotator stages include a round and right shift (RS) circuit adapted to round addition results and then right shift the addition results until a predetermined bit wide result remains for output.

5. The CORDIC of claim 1 wherein each cosine coefficient $a(i)$ is given by the following equation, $$a(i) = 2^c \cdot \cos\left(\frac{\pi}{4N}i + \frac{\pi}{8N}\right) \cdot CorrectionFactor$$

where,
    i is a natural number that ranges from 0 to N−1,
    c is a number of bits containing a value of $a(i)$, and
    CorrectionFactor is a dimensionless decimal value for reducing a mean error over a plurality of calculations.

6. The CORDIC of claim 5 wherein each sine coefficient $b(i)$ is given by the following equation, $$b(i) = 2^c \cdot \sin\left(\frac{\pi}{4N}i + \frac{\pi}{8N}\right) \cdot CorrectionFactor$$

where,
    i is a natural number that ranges from 0 to N−1,
    c is a number of bits containing a value of $b(i)$, and
    CorrectionFactor is a dimensionless correction factor for reducing a mean error over a plurality of calculations.

7. The CORDIC of claim 6 wherein the dimensionless correction factor is given by the following equation, $$b(i) = 2^c \cdot \sin\left(\frac{\pi}{4N}i + \frac{\pi}{8N}\right) \cdot CorrectionFactor.$$

8. The CORDIC of claim 1 further including mode circuitry adapted to output norms divided by the square root of two.

9. The CORDIC of claim 8 wherein the mode circuitry comprises:
    an input adder circuit to add the first component to the second component;
    a first divider circuit to divides results of the input adder circuit by two; and
    a first multiplexer for selecting either the first component or the results of the input adder circuit divided by two.

10. The CORD IC of claim 9 wherein the mode circuitry further comprises:
    an input subtractor circuit to subtract the second component from the first component;
    a second divider circuit to divides results of the input adder circuit by two; and
    a second multiplexer for selecting either the second component or the results of the input subtractor circuit divided by two.

11. An envelope tracking system comprising:
    a power amplifier module (PAM);
    a fast switch mode power supply (SMPS) converter adapted to supply modulated power to the PAM in response to an envelope tracking signal (ETS);
    an envelope tracking signal (ETS) generator adapted to drive the SMPS converter in response to a stream of vector norms; and
    a CORDIC for computing a stream of vector norms, each having a first component and a second component, comprising:
        a first maximum value circuit for outputting a maximum operand that is a larger one of either an absolute value of the first component or an absolute value of the second component;
        a minimum value circuit for outputting a minimum operand that is a smaller one of either an absolute value of the first component or an absolute value of the second component;
        N rotator stages, each corresponding to a unique one of N predetermined vectors, each having a first multiply circuit for multiplying the maximum operand by a cosine coefficient of a corresponding predetermined vector to output a first rotation component, a second multiply circuit for multiplying the minimum operand by a sine coefficient of the corresponding predetermined vector to output a second rotation component and an adder circuit for adding the first rotation component to the second rotation component to output one of N results; and
        a second maximum value circuit for outputting a maximum one of the N results.

12. The envelope tracking system of claim 11 wherein the N predetermined vectors are unit vectors.

13. The envelope tracking system of claim 11 wherein each adder circuit of the N rotator stages comprises:
    a results register having an overflow bit that is set when a result of an addition performed by the adder circuit is larger than the results register; and
    a results multiplexer that outputs the result of an addition performed by the adder circuit if the overflow bit is not set or outputs a predetermined maximum value if the overflow bit is set.

14. The envelope tracking system of claim 11 wherein each adder circuit of the N rotator stages include a round and right shift (RS) circuit adapted to round addition results and then right shift the addition results until a predetermined bit wide result remains for output.

15. The envelope tracking system of claim 11 wherein each cosine coefficient a(i) is given by the following equation, $$a(i) = 2^c \cdot \text{COS}\left(\frac{\pi}{4N}i + \frac{\pi}{8N}\right) \cdot CorrectionFactor$$

where,
    i is a natural number that ranges from 0 to N−1,
    c is a number of bits containing a value of a(i), and
    CorrectionFactor is a dimensionless decimal value for reducing a mean error over a plurality of calculations.

16. The envelope tracking system of claim 15 wherein each sine coefficient b(i) is given by the following equation, $$b(i) = 2^c \cdot \text{SIN}\left(\frac{\pi}{4N}i + \frac{\pi}{8N}\right) \cdot CorrectionFactor$$

where,
    i is a natural number that ranges from 0 to N−1,
    c is a number of bits containing a value of b(i), and
    CorrectionFactor is a dimensionless correction factor for reducing a mean error over a plurality of calculations.

17. The envelope tracking system of claim 16 wherein the dimensionless correction factor is given by the following equation, $$b(i) = 2^c \cdot \text{SIN}\left(\frac{\pi}{4N}i + \frac{\pi}{8N}\right) \cdot CorrectionFactor.$$

18. The envelope tracking system of claim 11 further including mode circuitry adapted to output norms divided by the square root of two.

19. The envelope tracking system of claim 18 wherein the mode circuitry comprises:
    an input adder circuit to add the first component to the second component;
    a first divider circuit to divides results of the input adder circuit by two; and
    a first multiplexer for selecting either the first component or the results of the input adder circuit divided by two.

20. The envelope tracking system of claim 19 wherein the mode circuitry further comprises:
    an input subtractor circuit to subtract the second component from the first component; and
    a second divider circuit to divides results of the input adder circuit by two; and a second multiplexer for selecting either the second component or the results of the input subtractor circuit divided by two.

* * * * *